(12) United States Patent
Namie et al.

(10) Patent No.: US 11,381,204 B2
(45) Date of Patent: Jul. 5, 2022

(54) POWER AMPLIFIER CIRCUIT

(71) Applicant: Murata Manufacturing Co., Ltd., Kyoto (JP)

(72) Inventors: Hisanori Namie, Kyoto (JP); Mitsunori Samata, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 47 days.

(21) Appl. No.: 16/671,626

(22) Filed: Nov. 1, 2019

(65) Prior Publication Data
US 2020/0144965 A1 May 7, 2020

(30) Foreign Application Priority Data
Nov. 2, 2018 (JP) .............................. JP2018-207343

(51) Int. Cl.
*H03F 1/02* (2006.01)
*H03F 1/56* (2006.01)

(52) U.S. Cl.
CPC .......... *H03F 1/0205* (2013.01); *H03F 1/565* (2013.01); *H03F 2200/387* (2013.01); *H03F 2200/411* (2013.01); *H03F 2200/451* (2013.01); *H03F 2200/516* (2013.01)

(58) Field of Classification Search
CPC .. H03F 1/0205; H03F 1/565; H03F 2200/516; H03F 2200/411; H03F 2200/451; H03F 2200/387; H03F 3/60; H03F 3/217

USPC ................... 330/302, 305, 296, 311
See application file for complete search history.

(56) References Cited

U.S. PATENT DOCUMENTS

| 9,503,025 | B2* | 11/2016 | Cao ................. H03F 1/565 |
| 10,135,395 | B2 | 11/2018 | Tanaka et al. |
| 2002/0180534 | A1* | 12/2002 | Bohn .............. H03F 3/217 330/302 |
| 2010/0033241 | A1 | 2/2010 | Mori et al. |
| 2010/0164632 | A1 | 7/2010 | Blednov et al. |
| 2016/0294333 | A1 | 10/2016 | Feng et al. |

FOREIGN PATENT DOCUMENTS

| JP | 2006-05643 A | 1/2006 |
| JP | 2016-195393 A | 11/2016 |
| KR | 10-2009-0087103 A | 8/2009 |

OTHER PUBLICATIONS

Cheng, "Two-Stage High-Efficiency Concurrent Dual-Band Harmonic-Tuned Power Amplifier" Microwave Theory and Technologies, Oct. 2016, IEEE vol. No. 10.*

* cited by examiner

*Primary Examiner* — Khanh V Nguyen
*Assistant Examiner* — Khiem D Nguyen
(74) *Attorney, Agent, or Firm* — Pearne & Gordon LLP

(57) ABSTRACT

A power amplifier circuit includes a first amplifier that amplifies a first signal, and a second amplifier arranged subsequent to the first amplifier. The second amplifier amplifies a second signal that is based on an output signal of the first amplifier. The first amplifier performs class inverse-F operation, and the second amplifier performs class F operation.

12 Claims, 13 Drawing Sheets

POWER AMPLIFIER CIRCUIT

This application claims priority from Japanese Patent Application No. 2018-207343 filed on Nov. 2, 2018. The content of this application is incorporated herein by reference in its entirety.

BACKGROUND

The present disclosure relates to a power amplifier circuit. In power amplifier circuits mounted in mobile communication devices such as mobile phones, it is desirable to increase the power of transmission signals with high efficiency. A known method to realize such high-efficiency power amplification is so-called class F operation. In the class F operation, reducing the temporal overlap between voltage and current waveforms at a transistor that performs power amplification reduces power consumption. For example, Japanese Unexamined Patent Application Publication No. 2006-5643 discloses a radio-frequency amplifier circuit in which an LC parallel resonator disposed at least one of between a collector of a transistor and an output terminal and between an emitter of the transistor and ground controls the second-order harmonic of a transmission signal so that the transistor is caused to perform class F operation.

To meet power level requirements for a transmission signal, a power amplifier circuit may have a configuration in which a plurality of transistors are connected in series such that the power of the transmission signal is amplified in a plurality of stages. Japanese Unexamined Patent Application Publication No. 2006-5643 assumes a single transistor stage, and no sufficient studies are made on a method for high-efficiency power amplification with a configuration in which a plurality of transistors are connected in series.

BRIEF SUMMARY

Accordingly, the present disclosure provides a power amplifier circuit that includes a plurality of amplifiers and that provides high-efficiency power amplification.

According to embodiments of the present disclosure, a power amplifier circuit includes a first amplifier that amplifies a first signal, and a second amplifier arranged subsequent to the first amplifier. The second amplifier amplifies a second signal that is based on an output signal of the first amplifier. The first amplifier performs class inverse-F operation, and the second amplifier performs class F operation.

According to embodiments of the present disclosure, it may be possible to provide a power amplifier circuit that includes a plurality of amplifiers and that provides high-efficiency power amplification.

Other features, elements, characteristics and advantages of the present disclosure will become more apparent from the following detailed description of embodiments of the present disclosure with reference to the attached drawings.

DETAILED DESCRIPTION

The following describes embodiments of the present disclosure in detail with reference to the drawings. The same or substantially the same elements are denoted by the same numerals, and will not be repeatedly described.

Figure 1:
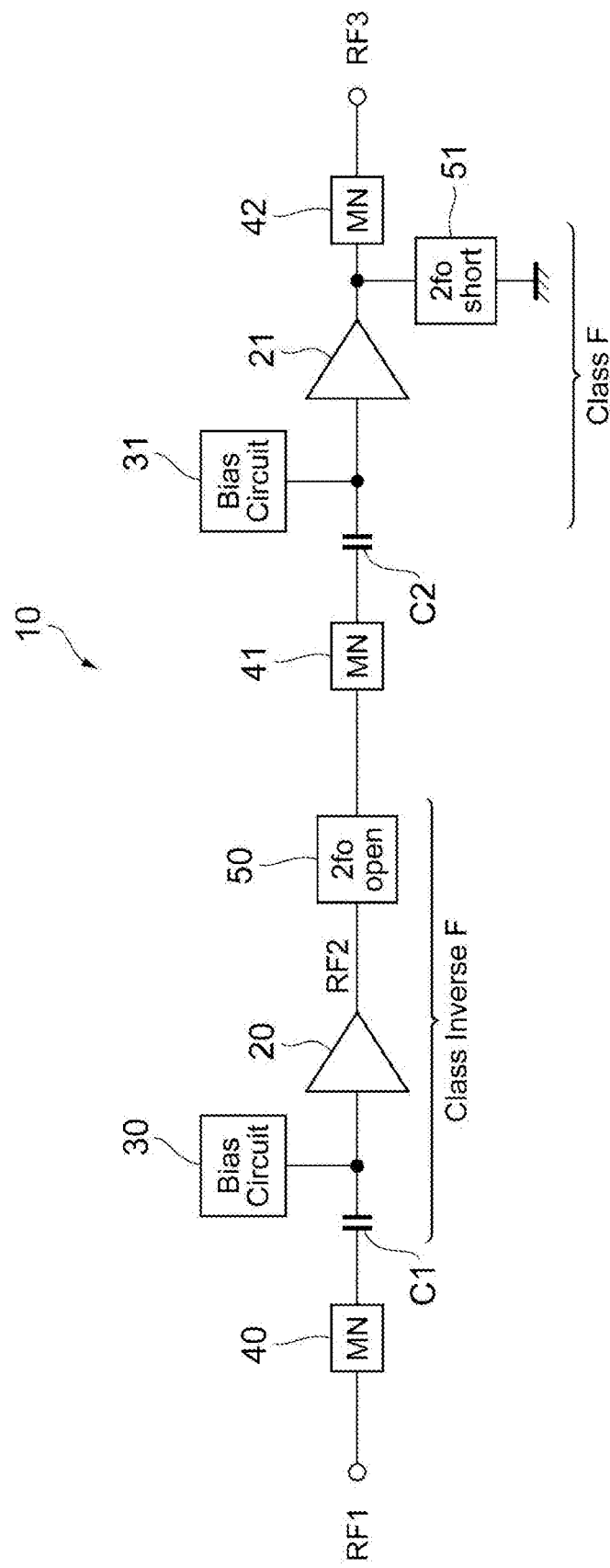
FIG. 1 illustrates an example configuration of a power amplifier circuit according to a first embodiment of the present disclosure.

FIG. 1 illustrates an example configuration of a power amplifier circuit 10 according to a first embodiment of the present disclosure. The power amplifier circuit 10 is mounted in, for example, a mobile communication device such as a mobile phone and is used to amplify the power of a radio-frequency (RF) signal to be transmitted to a base station. For example, the power amplifier circuit 10 amplifies transmission signals conforming to communication standards such as the second-generation mobile communication system (2G), the third-generation mobile communication system (3G), the fourth-generation mobile communication system (4G), the fifth-generation mobile communication system (5G), Long Term Evolution Frequency Division Duplex (LTE-FDD), LTE Time Division Duplex (LTE-TDD), LTE-Advanced, and LTE-Advanced Pro. The RF signal has a frequency of about several hundreds of megahertz (MHz) to about several tens of gigahertz (GHz), for example. The power amplifier circuit 10 may amplify signals having other frequencies and conforming to other communication standards.

As illustrated in FIG. 1, the power amplifier circuit 10 includes, for example, amplifiers 20 and 21, bias circuits 30 and 31, matching networks (MNs) 40 to 42, harmonic control circuits 50 and 51, and capacitors C1 and C2.

Each of the amplifiers 20 and 21 amplifies the power of an input RF signal and outputs a resulting signal. The initial (driver-stage) amplifier 20 (first amplifier) amplifies an RF signal RF1 (first signal) input from an input terminal via the matching network 40 and outputs an RF signal RF2. The subsequent (power-stage) amplifier 21 (second amplifier) amplifies the RF signal RF2 (second signal) input via the matching network 41 and outputs an RF signal RF3. In this way, the power amplifier circuit 10 amplifies the power of a transmission signal in two stages. Each of the amplifiers 20 and 21 is constituted by a bipolar transistor such as a heterojunction bipolar transistor (HBT), for example. Each of the amplifiers 20 and 21 may be constituted by a field-effect transistor such as metal-oxide-semiconductor field-effect transistor (MOSFET), instead of by an HBT. When the amplifiers 20 and 21 are each constituted by a MOSFET, the terms "collector", "base", and "emitter" in the following description are changed to the terms "drain", "gate", and "source", respectively.

The bias circuits 30 and 31 supply a bias current or bias voltage to the amplifiers 20 and 21, respectively. The bias circuits 30 and 31 adjust the bias current or bias voltage to control the gain of the amplifiers 20 and 21.

The capacitors C1 and C2 are disposed on the input side of the amplifiers 20 and 21, respectively. Each of the capacitors C1 and C2 blocks the direct-current component included in the RF signal and allows the alternating-current component in the RF signal to pass therethrough.

The matching network 40 matches the impedances of the preceding circuit (not illustrated) and the amplifier 20. The matching network 41 matches the impedances of the amplifier 20 and the amplifier 21. The matching network 42 matches the impedances of the amplifier 21 and the subsequent circuit (not illustrated). Each of the matching networks 40 to 42 is constituted by, for example, a capacitor and an inductor, or the like. The power amplifier circuit 10 may not include some or all of the matching networks 40 to 42 if any other constituent element has the function of some or all of the matching networks 40 to 42.

The harmonic control circuits 50 and 51 are circuits each configured to control harmonics that are integer multiples of a fundamental wave, where the fundamental wave is a transmission signal amplified by the power amplifier circuit 10. Specifically, the harmonic control circuit 50 is connected in series between an output end of the preceding amplifier 20 and an input end of the subsequent amplifier 21. The harmonic control circuit 50 has a frequency characteristic that provides an open circuit for an even-order harmonic (e.g., the second-order harmonic $2f_0$ contained in an output signal of the preceding amplifier 20. The harmonic control circuit 51 is connected in series between an output end of the subsequent amplifier 21 and the ground terminal. The harmonic control circuit 51 has a frequency characteristic that provides a short circuit to ground potential for an even-order harmonic (e.g., the second-order harmonic $2f_0$) contained in an output signal of the subsequent amplifier 21. With the harmonic control described above, the preceding amplifier 20 is controlled to perform class inverse-F operation, and the subsequent amplifier 21 is controlled to class F operation. Class F operation defines that at least one of even-order harmonics frequencies are short circuit in the amplifier circuit or at least one of odd-order harmonics frequencies are open circuit in the amplifier circuit.

Figure 2A:
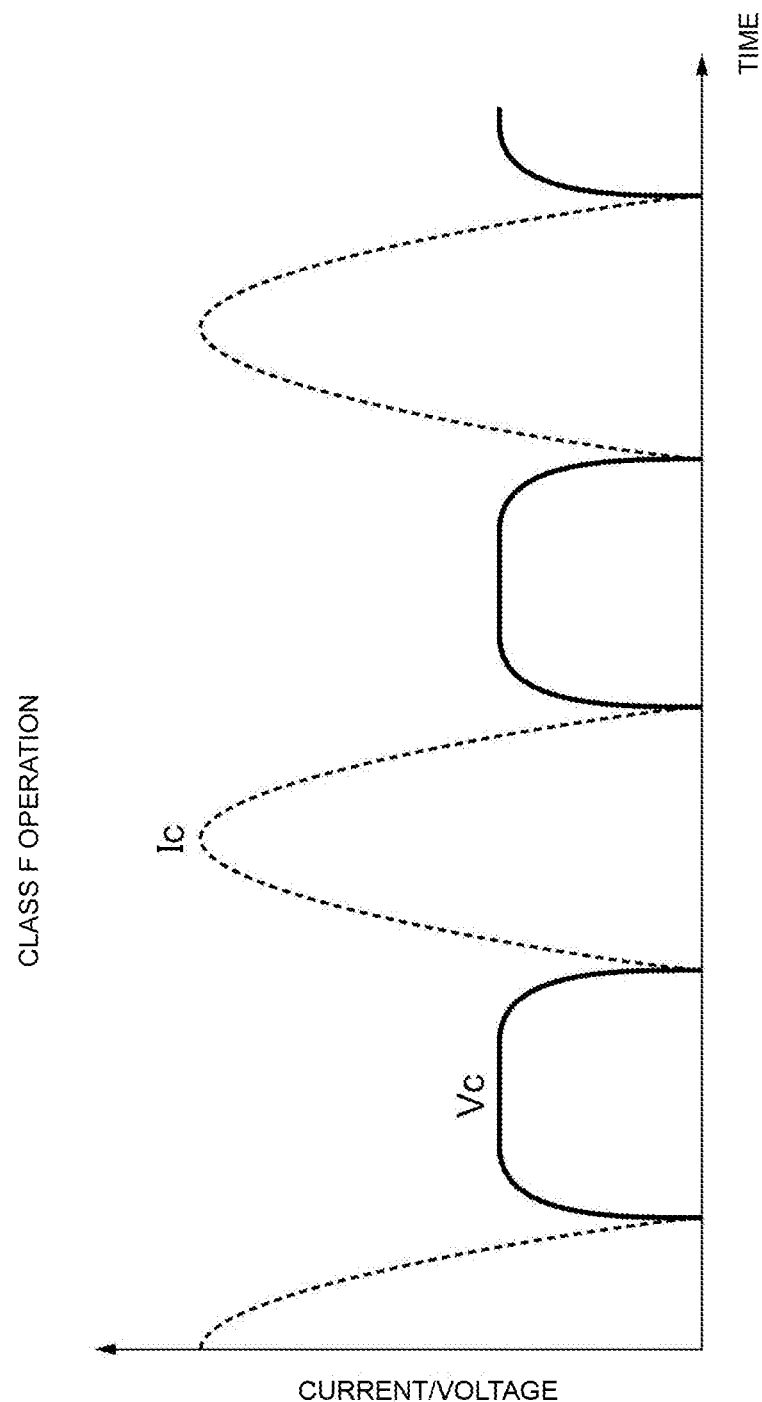
FIG. 2A depicts waveforms of a collector voltage (solid line) and a collector current (broken line) of a transistor when the transistor is caused to perform class F operation.
Figure 2B:
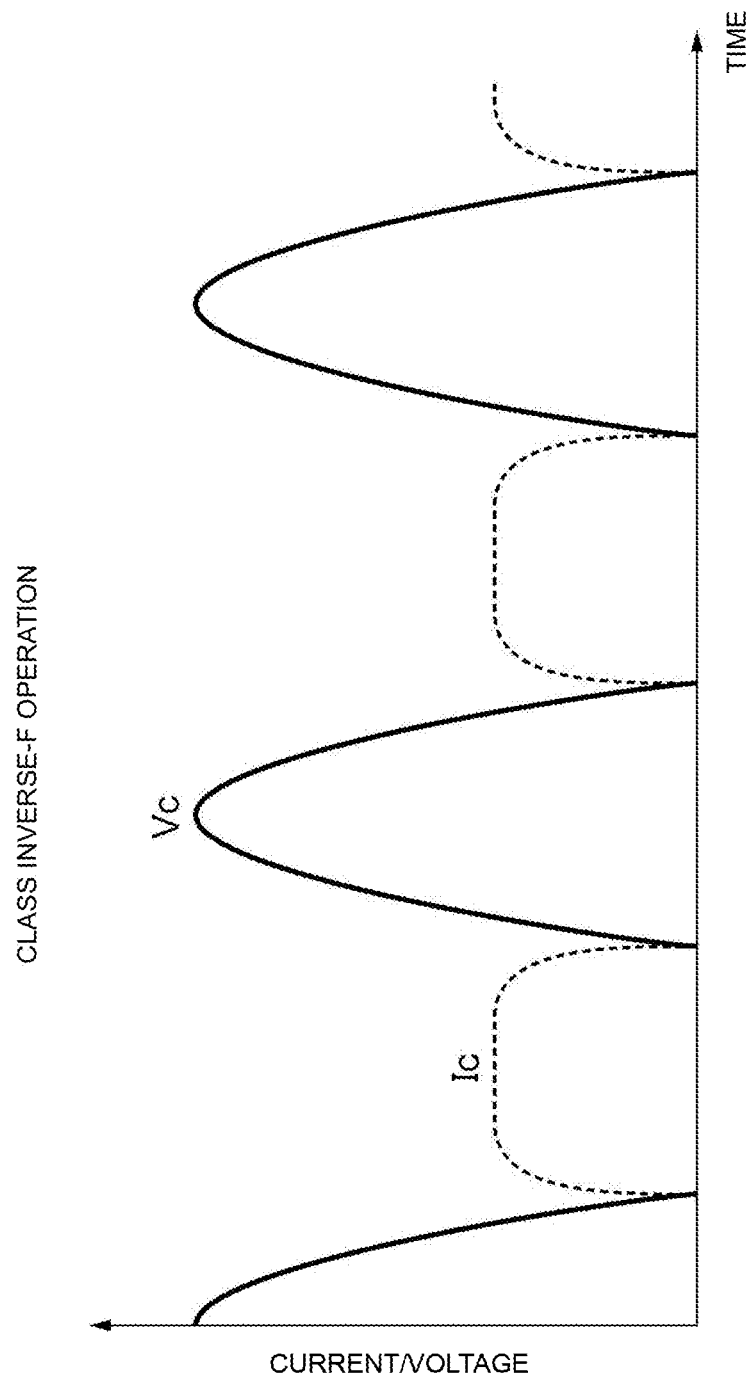
FIG. 2B depicts waveforms of the collector voltage (solid line) and the collector current (broken line) of the transistor when the transistor is caused to perform class inverse-F operation.

FIG. 2A depicts waveforms of a collector voltage Vc (solid line) and a collector current Ic (broken line) of a transistor when the transistor is caused to perform class F operation. FIG. 2B depicts waveforms of the collector voltage Vc (solid line) and the collector current Ic (broken line) of the transistor when the transistor is caused to perform class inverse-F operation. Class inverse-F operation defines that at least one of even-order harmonics frequencies are open circuit in the amplifier circuit or at least one of odd-order harmonics frequencies are short circuit in the amplifier circuit.

The class F operation is realized by performing control to provide a short circuit to ground potential for an even-order harmonic (e.g., the second-order harmonic, etc.) of the fundamental wave in an output signal and to provide an open circuit for an odd-order harmonic (e.g., the third-order harmonic, etc.) of the fundamental wave in the output signal. In the class F operation, as illustrated in FIG. 2A, the waveform of the collector voltage Vc is close to a rectangular waveform, and the waveform of the collector current Ic is close to a half-wave rectified waveform. Hence, phase adjustment is performed so that the waveform of the collector voltage Vc and the waveform of the collector current Ic do not overlap in peaks. In contrast, the class inverse-F operation is realized by performing control to provide an open circuit for an even-order harmonic (e.g., the second-order harmonic, etc.) of the fundamental wave in an output signal and to provide a short circuit to ground potential for an odd-order harmonic (e.g., the third-order harmonic, etc.) of the fundamental wave in the output signal. In the class inverse-F operation, as illustrated in FIG. 2B, the waveform of the collector voltage Vc is close to a half-wave rectified waveform, and the waveform of the collector current Ic is close to a rectangular waveform. Hence, phase adjustment is performed so that the waveform of the collector voltage Vc and the waveform of the collector current Ic do not overlap in peaks. In both the class F operation and the class inverse-F operation, the phase adjustments described above reduce the time period during which the waveform of the collector voltage Vc and the waveform of the collector current Ic overlap. Ideally, therefore, the power consumption (=collector current Ic×collector voltage Vc) of the amplifier becomes 0 W. In the class F operation and the class inverse-F operation, accordingly, the power-added efficiency of a power amplifier circuit is improved.

In the class F operation, since the current waveform is a half-wave rectified waveform, the parasitic resistance component of the transistor may affect power amplification characteristics. However, advantageously, the voltage waveform is a rectangular waveform, which can reduce the risk of exceeding the withstand voltage of the transistor. In the class inverse-F operation, in contrast, the voltage waveform is a half-wave rectified waveform, which may cause a risk of exceeding the withstand voltage of the transistor. However, since the current waveform is a rectangular waveform, advantageously, the parasitic resistance component is less likely to affect power amplification characteristics.

Instead of a configuration in which both an even-order harmonic and an odd-order harmonic are controlled, as in the following embodiments, a configuration in which either an even-order harmonic or an odd-order harmonic is controlled also allows an amplifier to perform class F operation or class inverse-F operation. Next, a specific configuration for controlling a harmonic will be described.

Figure 3:
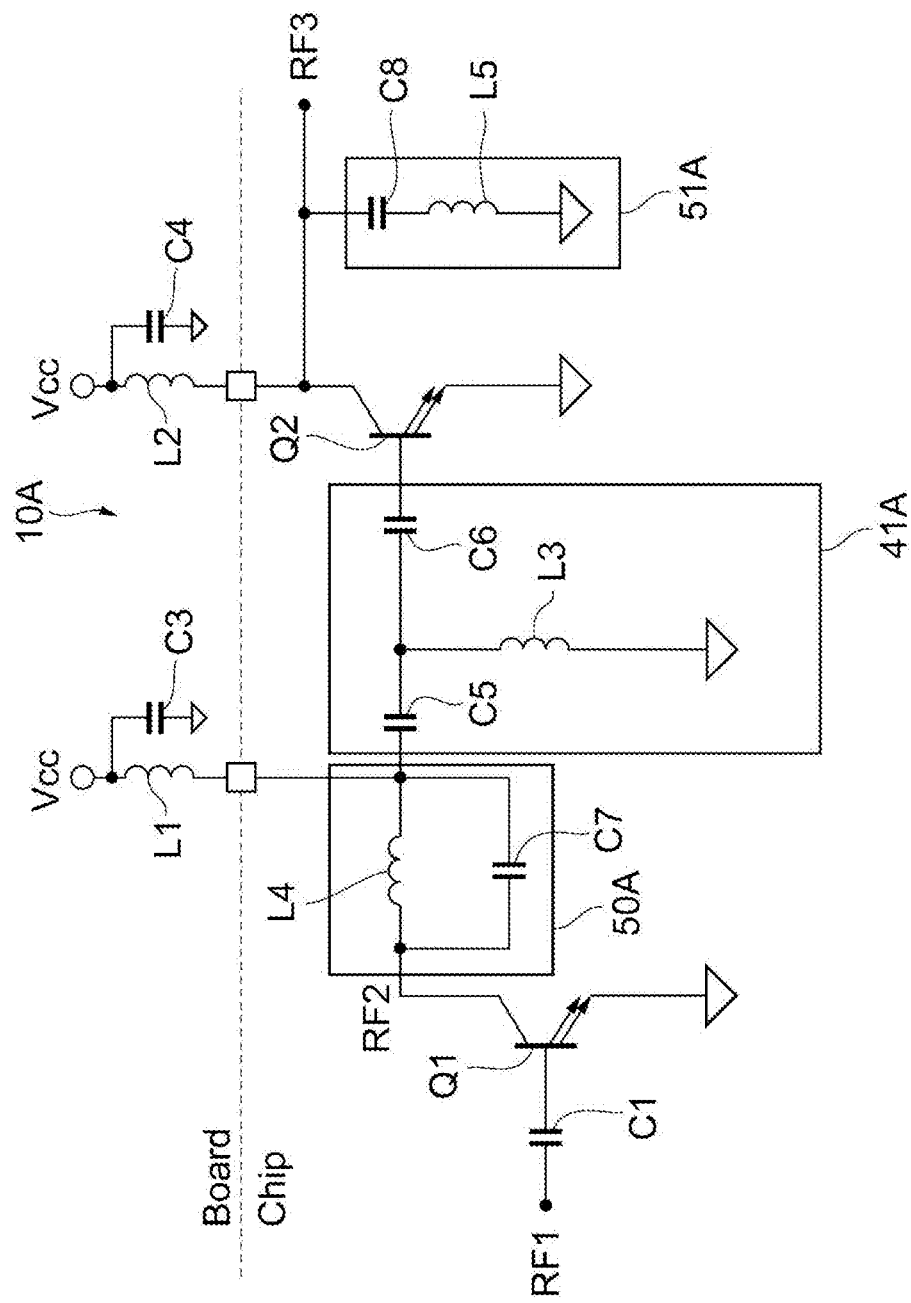
FIG. 3 illustrates the circuit configuration of the power amplifier circuit according to the first embodiment of the present disclosure.

FIG. 3 illustrates the circuit configuration of a power amplifier circuit 10A according to the first embodiment of the present disclosure.

In the power amplifier circuit 10A illustrated in FIG. 3, among the elements of the power amplifier circuit 10 illustrated in FIG. 1, an example specific configuration of the amplifiers 20 and 21, the harmonic control circuits 50 and 51, and the matching network 41 is illustrated. In the power amplifier circuit 10A, the bias circuits 30 and 31 and the matching networks 40 and 42 are not illustrated.

The amplifier 20 is constituted by a transistor Q1. The transistor Q1 has a collector to which a power supply voltage Vcc (first power supply voltage) is supplied via an inductor L1 and an inductor L4, an emitter connected to ground, and a base to which the RF signal RF1 is supplied via the capacitor C1. The transistor Q1 outputs, from the collector thereof, the RF signal RF2 obtained by amplifying the RF signal RF1.

The amplifier 21 is constituted by a transistor Q2. The transistor Q2 has a collector to which the power supply voltage Vcc is supplied via an inductor L2, an emitter connected to ground, and a base to which the RF signal RF2 is supplied via a harmonic control circuit 50A and a matching network 41A. The transistor Q2 outputs, from the collector thereof, the RF signal RF3 obtained by amplifying the RF signal RF2.

In FIG. 3, each of the transistors Q1 and Q2 is identified by a single circuit symbol. Alternatively, the transistors Q1 and Q2 may have a configuration in which a plurality of unit transistors are connected in parallel. The term "unit transistor", as used herein, refers to a minimum element that functions as a transistor.

The inductor L1 has an end to which the power supply voltage Vcc is supplied, and another end connected to the collector of the transistor Q1. The inductor L2 has an end to which the power supply voltage Vcc is supplied, and another end connected to the collector of the transistor Q2. Each of a capacitor C3 and a capacitor C4 has an end to which the power supply voltage Vcc is supplied, and another end connected to ground. The inductors L1 and L2 and the capacitors C3 and C4 are provided to suppress leakage of an RF signal toward a power supply circuit (not illustrated).

The matching network 41A includes capacitors C5 and C6 and an inductor L3. The capacitor C5 and the capacitor C6 are connected in series with each other. The inductor L3 has an end connected to a node between the capacitor C5 and the capacitor C6 and another end connected to ground. That is, the matching network 41A is constituted by a so-called C-L-C T-type circuit. Instead of the T-type circuit, the matching network 41 may be constituted by, for example, a π-type circuit. In addition, the capacitor C5 and the capacitor C6 may have a function corresponding to the function of the capacitor C2 illustrated in FIG. 1.

The harmonic control circuit 50A is connected in series between the collector (output end) of the transistor Q1 and an input end of the matching network 41A (i.e., an end of the capacitor C5), for example. The harmonic control circuit 50A is constituted by a parallel resonant circuit including a capacitor C7 (first capacitor) and the inductor L4 (first inductor) that are connected in parallel with each other. The parallel resonant circuit has a frequency characteristic in which the impedance is much higher at the resonant frequency of the parallel resonant circuit than at other frequencies. In this embodiment, the harmonic control circuit 50A is set so that the resonant frequency is included in the frequency band of the second-order harmonic or is near the frequency band of the second-order harmonic, and thus provides an open circuit for the second-order harmonic. The term "providing an open circuit", as used herein, is used to indicate not only a state in which the impedance is exactly infinite but also a state in which the impedance is much higher at the frequency than at other frequencies.

In the harmonic control circuit 50A, the capacitor C7 forms a parallel resonant circuit together with the inductor L4. The capacitor C7 has a smaller capacitance value than, for example, the capacitor C5, which is provided to block the direct-current component. The inductor L4 forms a parallel resonant circuit together with the capacitor C7, and matches the impedances of the preceding amplifier and the subsequent amplifier. The inductor L4 has a smaller inductance value than, for example, the inductor L1, which is provided to block a signal. The inductor L4 may be formed of, for example, a wiring routed in a predetermined pattern in or on the same semiconductor chip as the semiconductor chip having the transistors Q1 and Q2 and so on.

In this embodiment, the power supply voltage Vcc is supplied to the end of the inductor L4 closer to the transistor Q2 (i.e., a node between the inductor L4 and the capacitor C5). Since the parallel resonant circuit is arranged closer to the amplifier 20 (i.e., on the input side) than the supply line of the power supply voltage Vcc, no consideration needs to be taken of the impedance on the power supply voltage Vcc side in the designing of the constants of the capacitor C7 and the inductor L4 of the parallel resonant circuit. Thus, the capacitor C7 and the inductor L4 can be designed more easily than in a configuration in which the power supply voltage Vcc is supplied to the end of the inductor L4 closer to the transistor Q1. In a configuration in which the power supply voltage Vcc is supplied to the transistor Q1 via the inductor L4, a relatively large amount of current flows through the inductor L4. However, the amount of current in the preceding amplifier is smaller than that in the subsequent amplifier. Thus, the flow of a large amount of current through the inductor L4 is less influential than in a case where this configuration is used in the subsequent stage.

A harmonic control circuit 51A is connected in series between the collector (output end) of the transistor Q2 and the ground terminal, for example. The harmonic control circuit 51A is constituted by a series resonant circuit including a capacitor C8 and an inductor L5 that are connected in series with each other. The series resonant circuit has a frequency characteristic in which the impedance is much lower at the resonant frequency of the series resonant circuit than at other frequencies. In this embodiment, the harmonic control circuit 51A is set so that the resonant frequency is included in the frequency band of the second-order harmonic or is near the frequency band of the second-order harmonic, and thus provides a short circuit to ground potential for the second-order harmonic. The term "providing a short circuit", as used herein, is used to indicate not only a state in which the impedance is exactly zero but also a state in which the impedance is much lower at the frequency than at other frequencies.

With the configuration described above, the initial amplifier 20 (the transistor Q1) is controlled to perform class inverse-F operation by providing an open circuit for the second-order harmonic, whereas the subsequent amplifier 21

(the transistor Q2) is controlled to class F operation by providing a short circuited to ground potential for the second-order harmonic. Accordingly, in a configuration including a plurality of amplifiers, high-efficiency power amplification can be implemented.

This embodiment provides a configuration including two stages of amplifiers. However, the number of stages of amplifiers is not limited to two, and three or more stages of amplifiers may be included. In a power amplifier circuit including three or more stages of amplifiers, one of the amplifiers may be controlled to perform class inverse-F operation, and an amplifier subsequent to the amplifier among the amplifiers may be controlled to perform class F operation.

Figure 4:
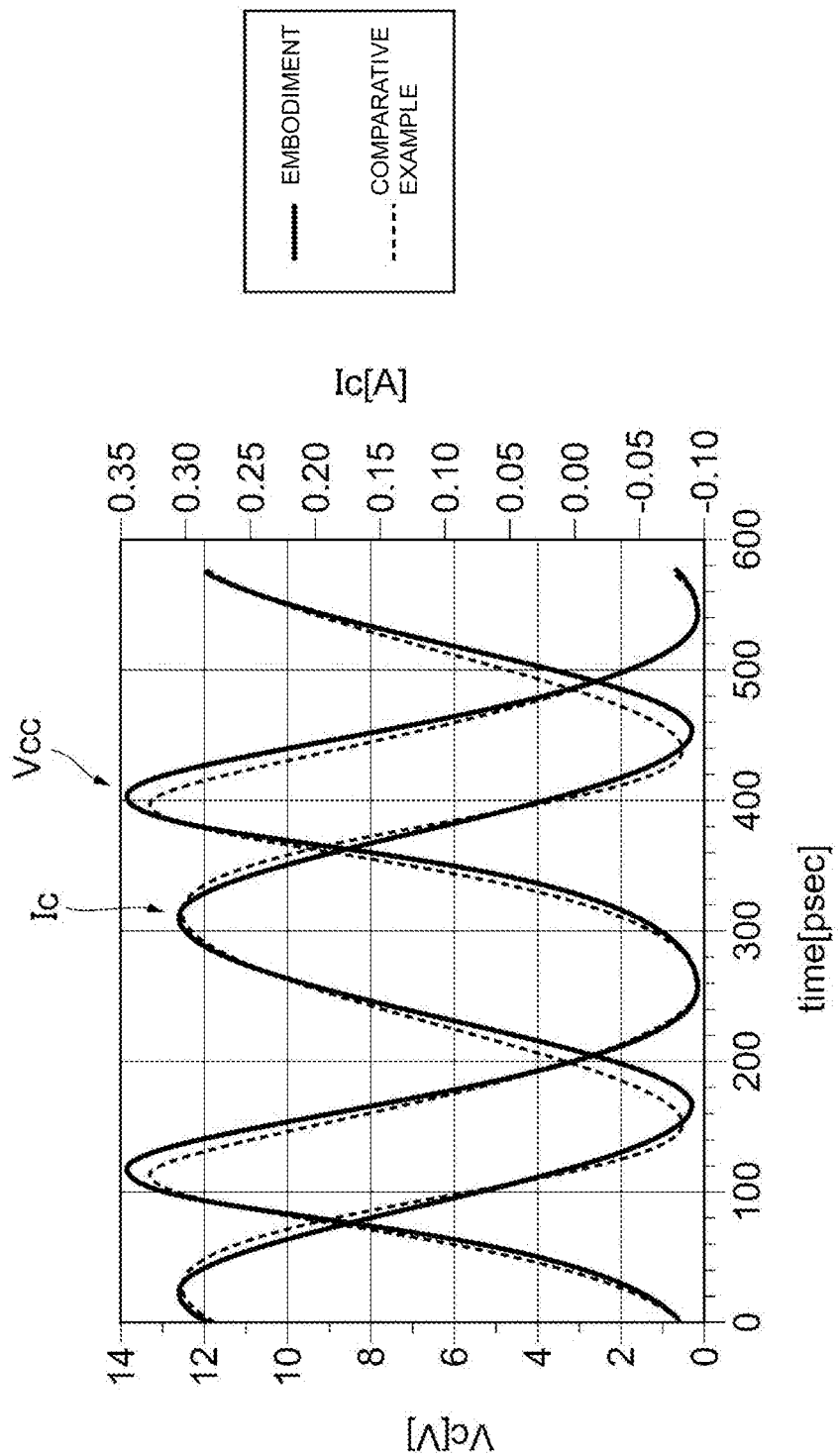
FIG. 4 is a graph illustrating simulation results of waveforms of a collector voltage and a collector current of a preceding transistor in the power amplifier circuit illustrated in FIG. 3 and a power amplifier circuit of a comparative example.

FIG. 4 is a graph illustrating simulation results of waveforms of a collector voltage and a collector current of a preceding transistor in the power amplifier circuit 10A and a power amplifier circuit of a comparative example. The power amplifier circuit of the comparative example is obtained by removing the capacitor C7 from the power amplifier circuit 10A illustrated in FIG. 3 (i.e., no parallel resonant circuit is formed). In FIG. 4, the vertical axis represents the collector voltage Vc (V) and the collector current Ic (A), and the horizontal axis represents time (psec). In this simulation, the fundamental frequency was set to 3.5 GHz.

As illustrated in FIG. 4, in the power amplifier circuit 10A, when the collector voltage Vc is higher than that in the power amplifier circuit of the comparative example, the amount of the collector current Ic becomes smaller, and when the amount of the collector current Ic is smaller than that in the power amplifier circuit of the comparative example, the collector voltage Vc increases. Accordingly, in the power amplifier circuit 10A, a reduction in the size of the area where the waveform of the collector voltage Vc and the waveform of the collector current Ic overlap reduces power loss. This indicates that the power amplifier circuit 10A achieves improved efficiency compared with the power amplifier circuit of the comparative example.

Figure 5A:
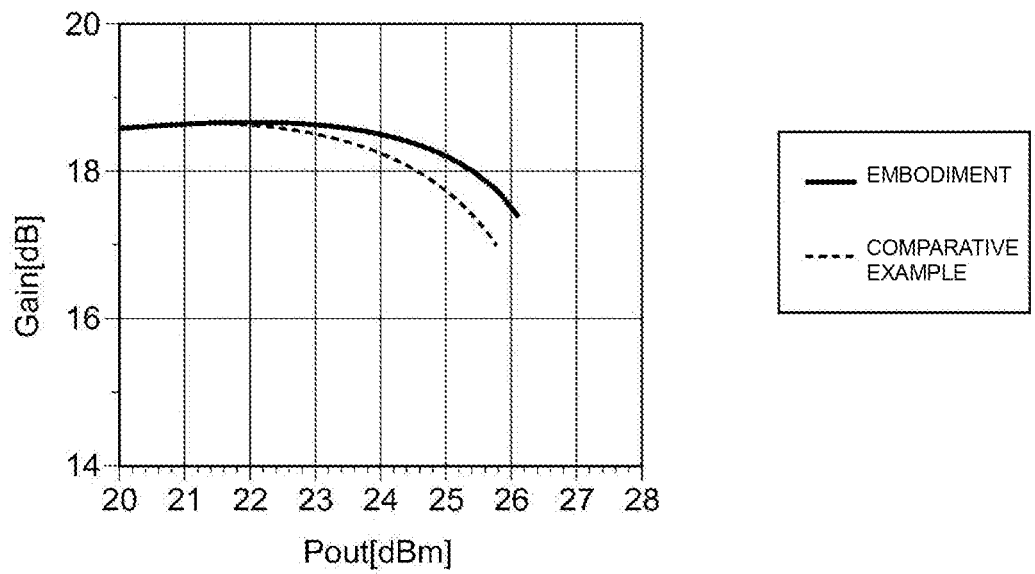
FIG. 5A is a graph illustrating simulation results with respect to the gain of the preceding transistor in the power amplifier circuit illustrated in FIG. 3 and the power amplifier circuit of the comparative example.
Figure 5B:
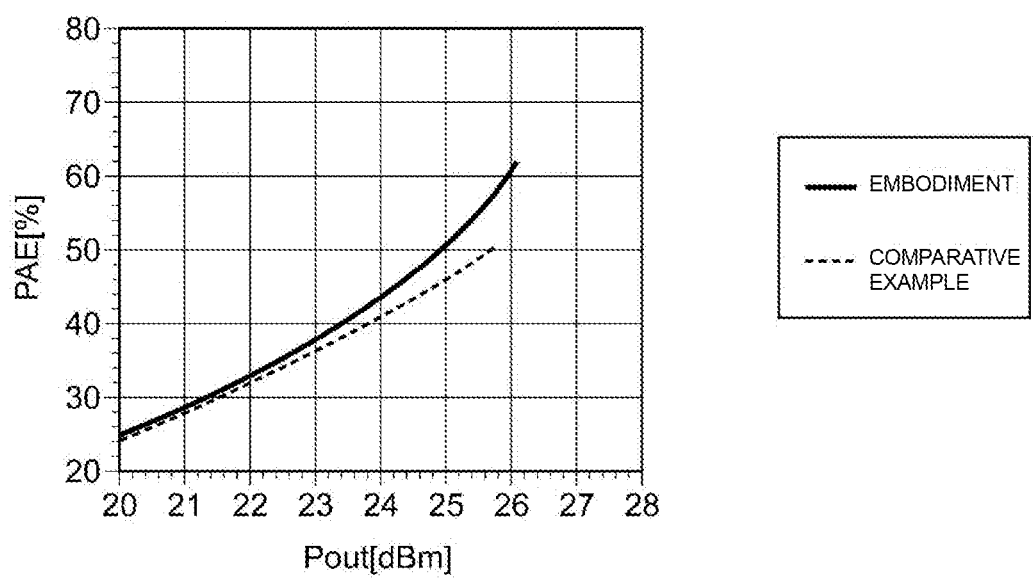
FIG. 5B is a graph illustrating simulation results with respect to the power-added efficiency of the preceding transistor in the power amplifier circuit illustrated in FIG. 3 and the power amplifier circuit of the comparative example.

FIG. 5A is a graph illustrating simulation results with respect to the gain of the preceding transistor in the power amplifier circuit 10A and the power amplifier circuit of the comparative example. FIG. 5B is a graph illustrating simulation results with respect to the power-added efficiency of the preceding transistor in the power amplifier circuit 10A and the power amplifier circuit of the comparative example. In FIG. 5A, the vertical axis represents gain (dB), and the horizontal axis represents output power Pout (dBm). In FIG. 5B, the vertical axis represents power-added efficiency (%), and the horizontal axis represents output power Pout (dBm). In this simulation, the fundamental frequency was set to 3.5 GHz.

As illustrated in FIG. 5A, in the power amplifier circuit 10A, the reduction in gain with an increase in output power is suppressed compared with the power amplifier circuit of the comparative example, and gain linearity is improved. As illustrated in FIG. 5B, in the power amplifier circuit 10A, power-added efficiency is improved with an increase in output power, compared with the power amplifier circuit of the comparative example.

Figure 6A:
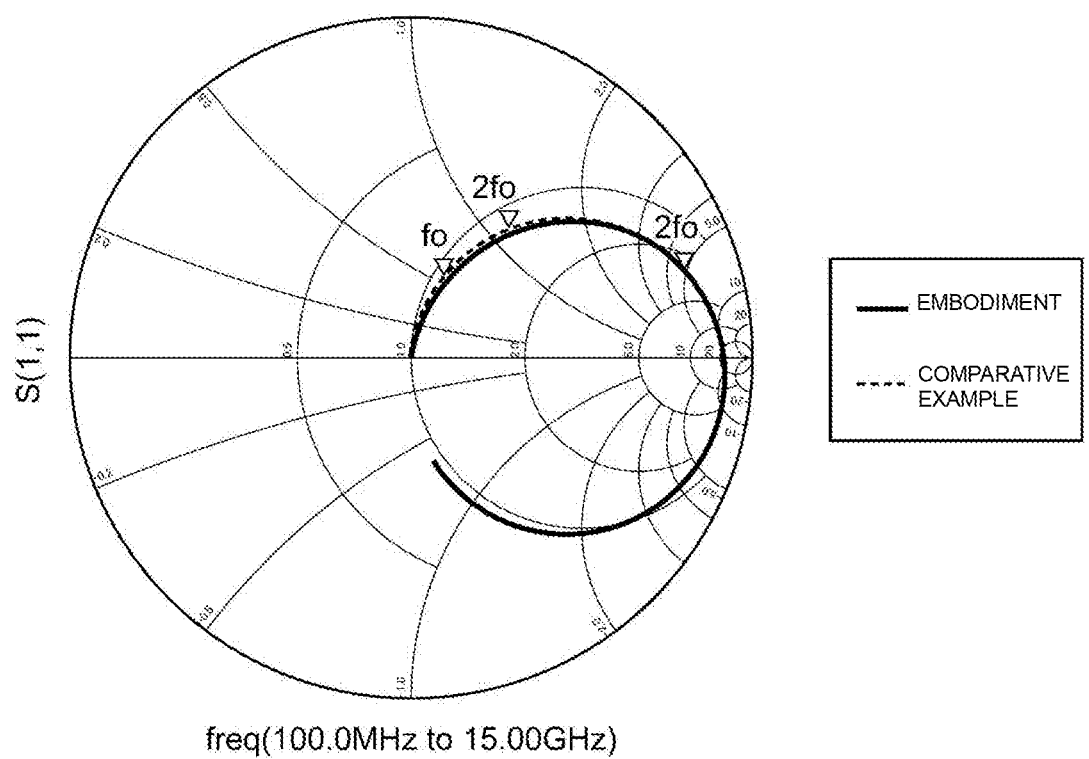
FIG. 6A is a Smith chart illustrating the reflection characteristic (scattering parameter (S-parameter) $S_{11}$) on the matching network side seen from the preceding transistor in the power amplifier circuit illustrated in FIG. 3 and the power amplifier circuit of the comparative example.

FIG. 6A is a Smith chart illustrating the reflection characteristic (scattering parameter (S-parameter) $S_{11}$) on the matching network 41A side seen from the preceding transistor in the power amplifier circuit 10A and the power amplifier circuit of the comparative example. That is, reflection characteristics on the output side seen from the transistor Q1 when the harmonic control circuit 50A is included and when the harmonic control circuit 50A is not included are illustrated. In FIG. 6A, symbol $f_0$ denotes the fundamental frequency in the power amplifier circuit 10A and the power amplifier circuit of the comparative example, and two symbols $2f_0$ respectively denote the second-order harmonic frequency in the power amplifier circuit 10A and the second-order harmonic frequency in the power amplifier circuit of the comparative example.

Figure 6B:
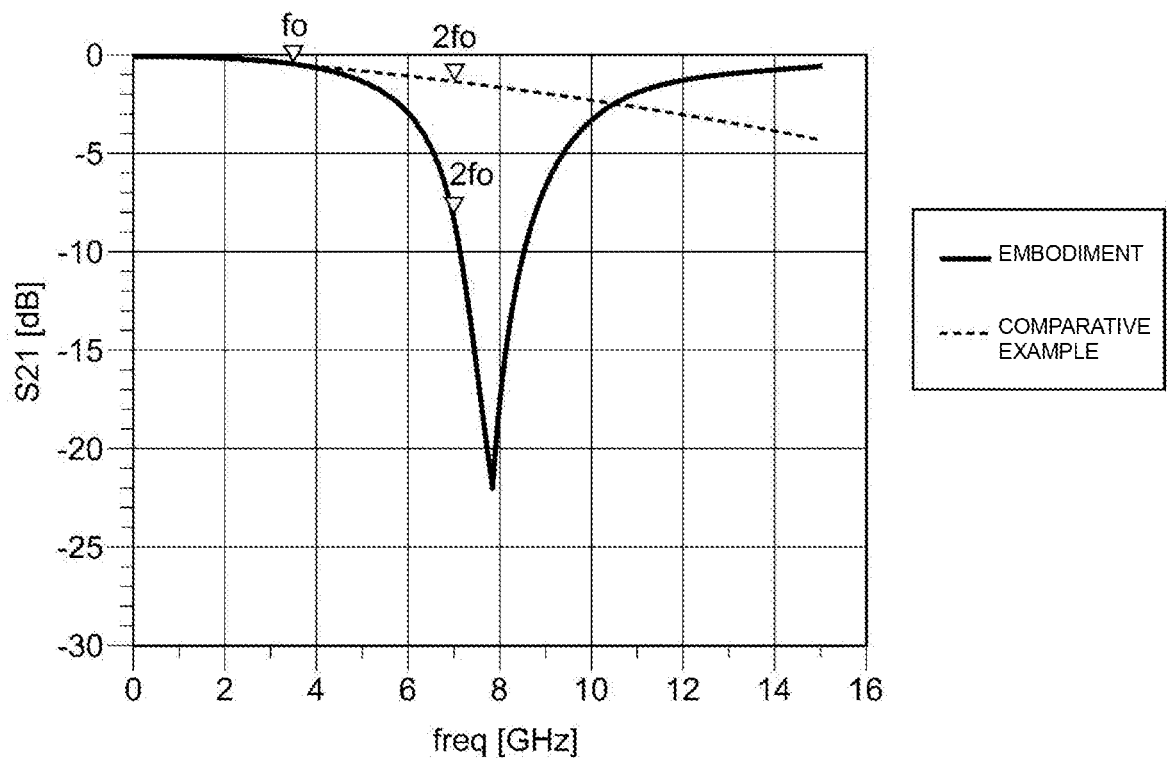
FIG. 6B is a graph illustrating simulation results of the bandpass characteristic (S-parameter $S_{21}$) of the preceding transistor in the power amplifier circuit illustrated in FIG. 3 and the power amplifier circuit of the comparative example.

FIG. 6B is a graph illustrating simulation results of the bandpass characteristic (S-parameter $S_{21}$) of the preceding transistor in the power amplifier circuit 10A and the power amplifier circuit of the comparative example. In FIG. 6B, the vertical axis represents the S-parameter $S_{21}$ (dB) of the preceding transistor, and the horizontal axis represents frequency (GHz). In the simulation illustrated in FIG. 6A and FIG. 6B, the signal frequency was changed from 100 MHz to 15 GHz.

As illustrated in FIG. 6A, for example, assuming that the fundamental frequency is 3.5 GHz, it is found that, at about 7.0 GHz, which is the second-order harmonic frequency, the impedance becomes higher in the power amplifier circuit 10A than in the power amplifier circuit of the comparative example and is hence close to an open circuit. It is also found that, as illustrated in FIG. 6B, in the power amplifier circuit 10A, the signal is greatly attenuated at about the second-order harmonic frequency, whereas the attenuation at the fundamental frequency is almost the same as that in the power amplifier circuit of the comparative example. This indicates that the power amplifier circuit 10A can selectively attenuate the second-order harmonic while suppressing the loss of the fundamental wave.

Figure 7:
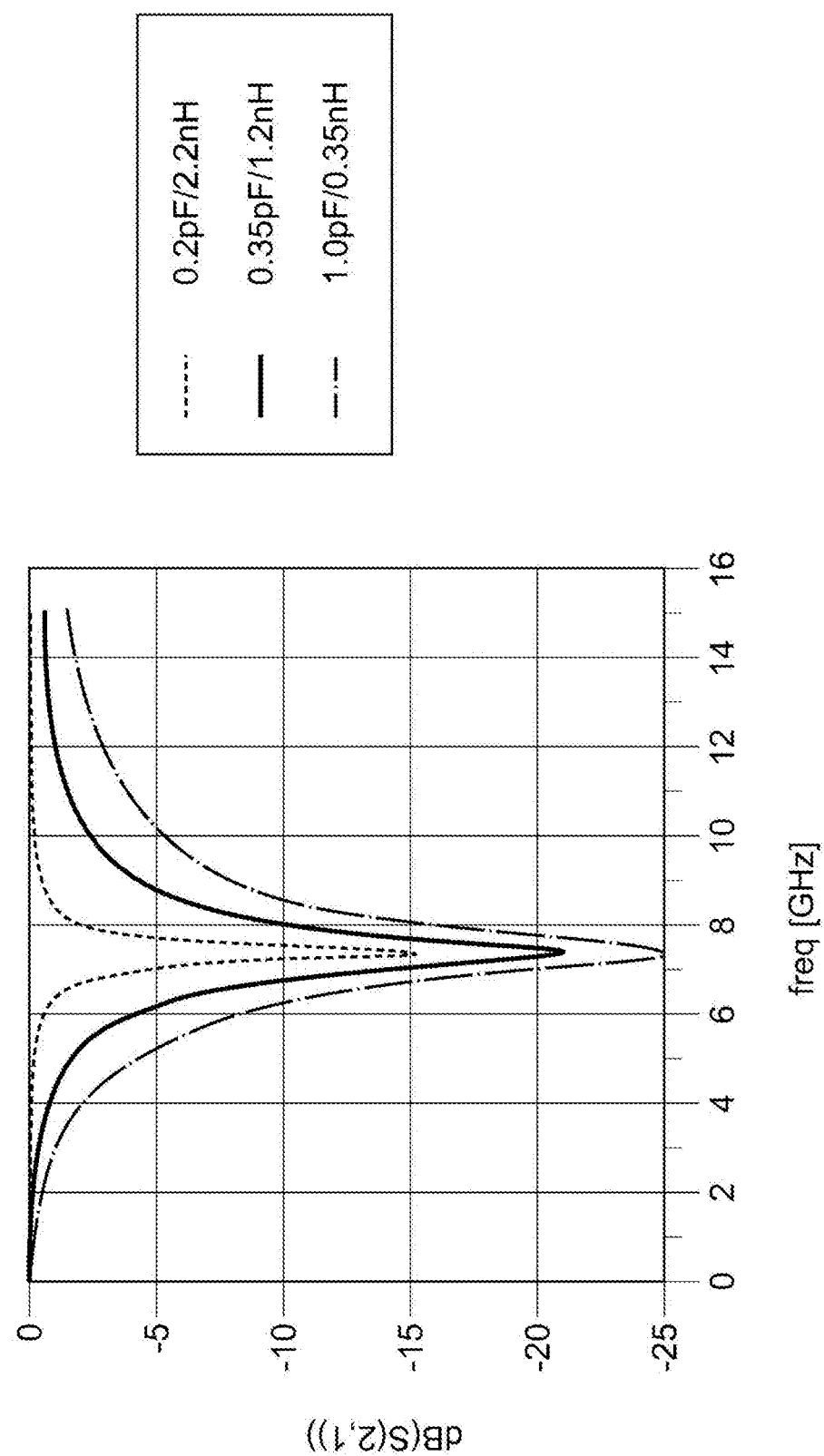
FIG. 7 is a graph illustrating simulation results of the bandpass characteristic (S-parameter $S_{21}$) of the preceding transistor in the power amplifier circuit illustrated in FIG. 3 when the constants of a capacitor and an inductor of a parallel resonant circuit were changed.

FIG. 7 is a graph illustrating simulation results of the bandpass characteristic (S-parameter $S_{21}$) of the preceding transistor in the power amplifier circuit 10A when the constants of the capacitor C7 and the inductor L4 of the parallel resonant circuit were changed. This simulation shows the bandpass characteristics obtained when combinations of capacitance values C of a capacitor and inductance values L of an inductor were C=0.2 pF and L=2.2 nH, C=0.35 pF and L=1.2 nH, and C=1.0 pF and L=0.35 nH. In FIG. 7, the vertical axis represents the S-parameter $S_{21}$ (dB) of the preceding transistor, and the horizontal axis represents frequency (GHz).

As illustrated in FIG. 7, as the capacitance value of the capacitor C7 increases, the attenuation of the second-order harmonic increases, and the attenuation of the fundamental wave also increases accordingly. The combination of the capacitance value of the capacitor C7 and the inductance value of the inductor L4 can be designed, as appropriate, based on the amount of loss of the fundamental wave, the required level of power efficiency, matching conditions of each matching network, and so on.

Figure 8:
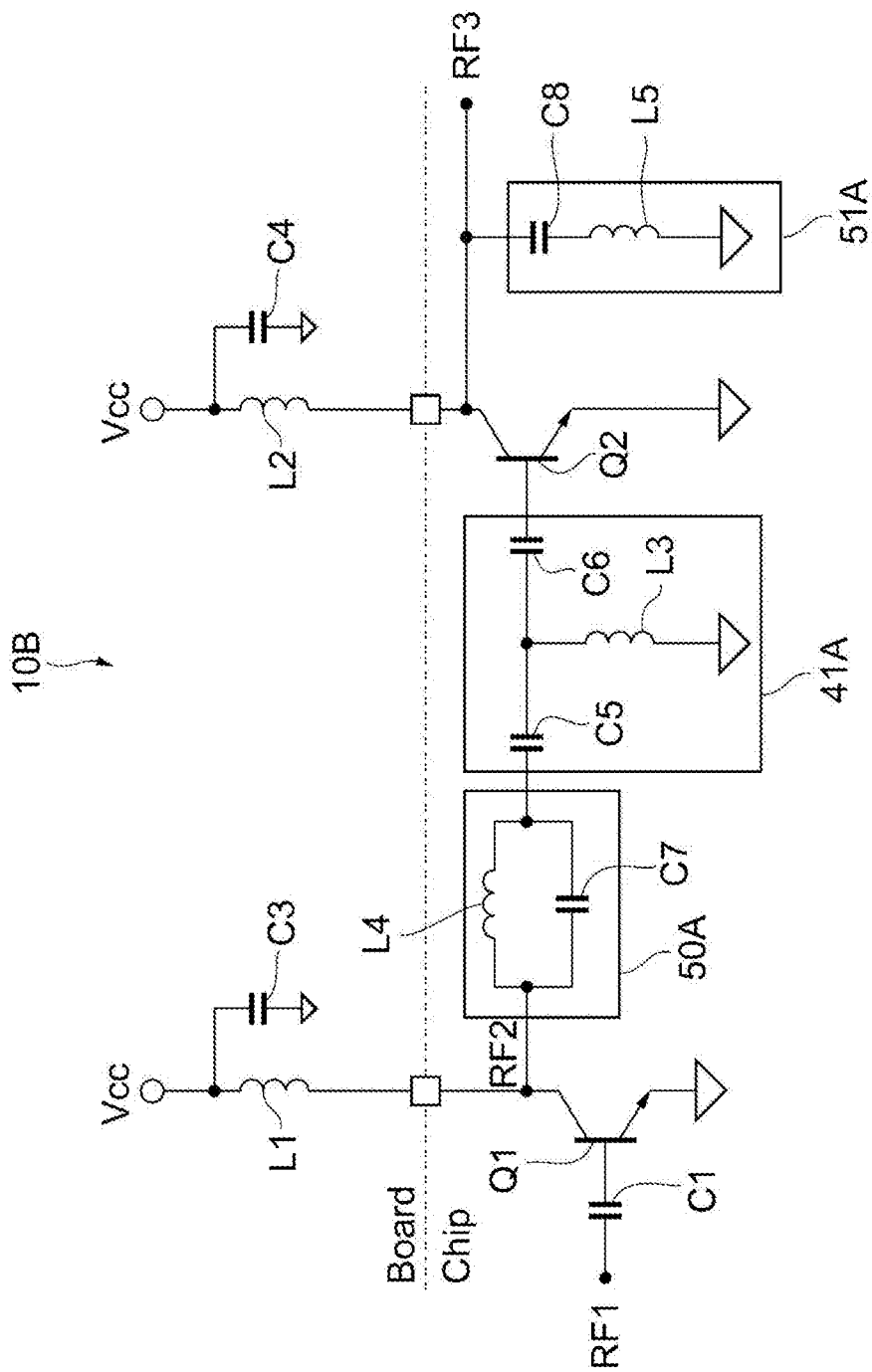
FIG. 8 illustrates the circuit configuration of a power amplifier circuit according to a modification of the first embodiment of the present disclosure.

FIG. 8 illustrates the circuit configuration of a power amplifier circuit 10B according to a modification of the first embodiment of the present disclosure. In this modification and the following modification and embodiment, features common to the first embodiment will not be described, and only the differences will be described. In particular, similar operational effects achieved with similar configurations will not be described again in the individual modifications and embodiments.

As illustrated in FIG. 8, the power amplifier circuit 10B is different from the power amplifier circuit 10A in the position at which a power supply voltage for the preceding amplifier is supplied. Specifically, in the power amplifier circuit 10B, the other end of the inductor L1 is connected to a node between the transistor Q1 and the harmonic control circuit 50A. In this manner, the power supply voltage Vcc may be supplied to the transistor Q1 without necessarily passing through the parallel resonant circuit. In this case, the occurrence of a voltage drop caused by the resistance component of the inductor L4 of the parallel resonant circuit can be avoided compared with the power amplifier circuit 10A described above.

Figure 9:
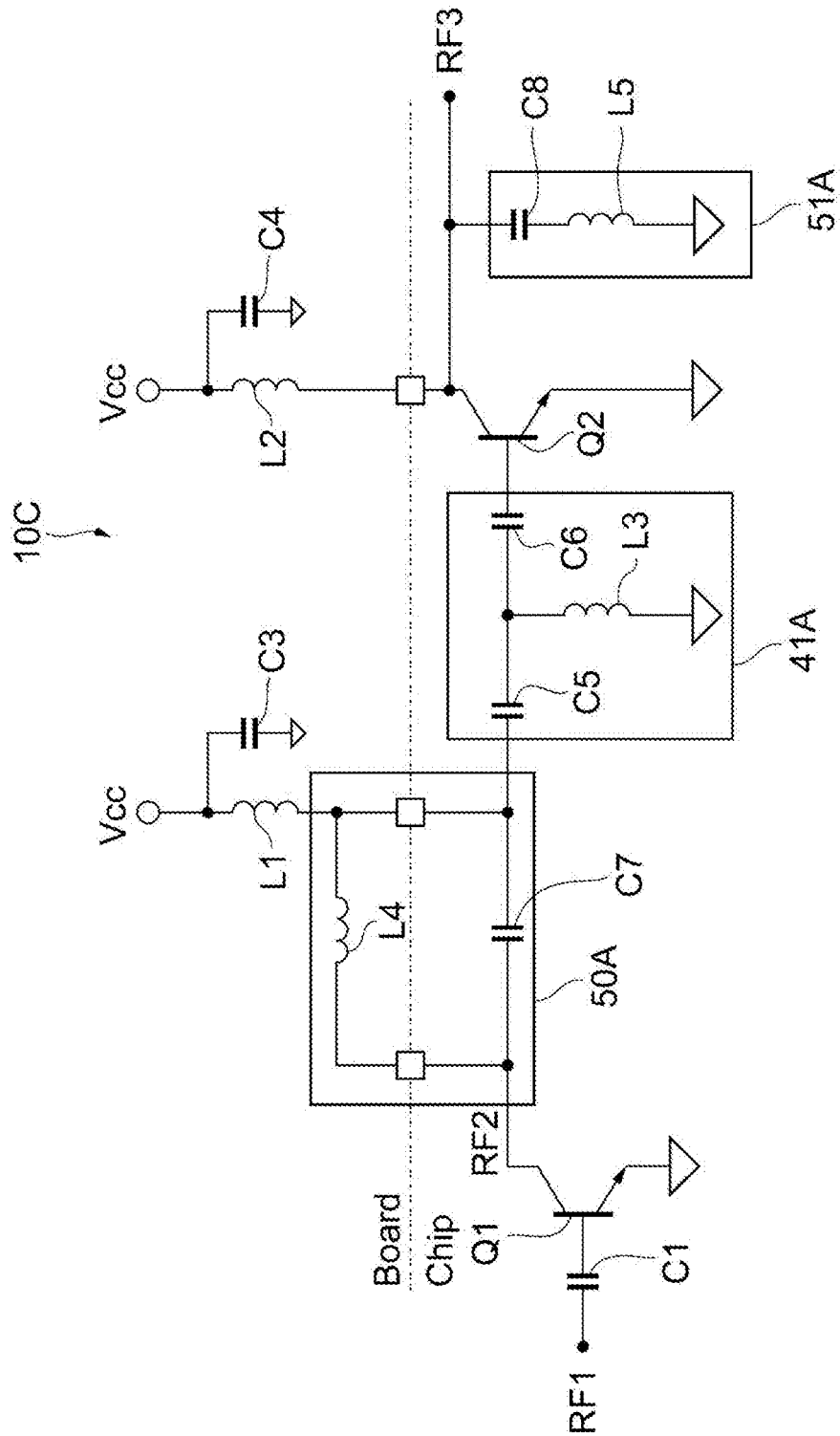
FIG. 9 illustrates the circuit configuration of a power amplifier circuit according to another modification of the first embodiment of the present disclosure.

FIG. 9 illustrates the circuit configuration of a power amplifier circuit 10C according to another modification of the first embodiment of the present disclosure.

As illustrated in FIG. 9, the power amplifier circuit 10C has a circuit configuration similar to that of the power amplifier circuit 10A described above, and is different from the power amplifier circuit 10A in the method for forming the inductor L4 of the parallel resonant circuit. In this modification, the inductor L4 is formed outside a semiconductor chip having the transistors Q1 and Q2 and so on. Specifically, for example, the inductor L4 may be formed by an inductance element or by a bonding wire or bump that electrically connects the semiconductor chip and a board having the semiconductor chip to each other. Alternatively, the inductor L4 may be formed by a wiring formed in or on the board. As described above, the method for forming the inductor L4 is not limited to any specific one.

In the configuration in which the inductor L4 is disposed outside the semiconductor chip, the wiring width of the inductor L4 is more likely to be increased compared with a configuration in which the inductor L4 is formed by a wiring in or on the semiconductor chip, improving the Q value of the parallel resonant circuit. Thus, the configuration described above can suppress the loss of the fundamental wave, compared with a configuration in which the inductor L4 is provided in the semiconductor chip.

In the power amplifier circuit 10C, as in the power amplifier circuit 10B described above, the power supply voltage Vcc may be supplied to the transistor Q1 without necessarily passing through the inductor L4.

Figure 10:
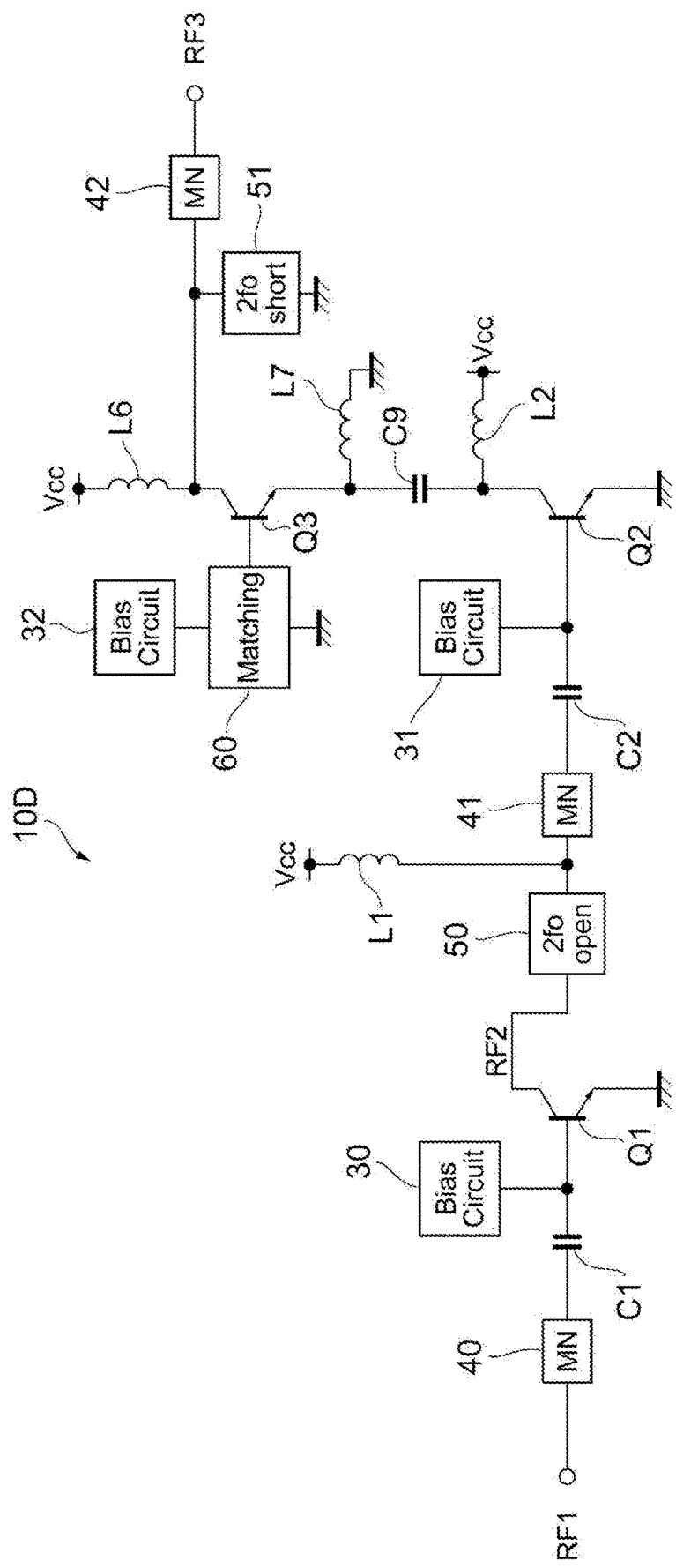
FIG. 10 illustrates the circuit configuration of a power amplifier circuit according to a second embodiment of the present disclosure.

FIG. 10 illustrates the circuit configuration of a power amplifier circuit 10D according to a second embodiment of the present disclosure.

As illustrated in FIG. 10, in the power amplifier circuit 10D, the configuration of the subsequent amplifier 21 is different from that in the embodiment described above. Specifically, unlike the power amplifier circuit 10A, the power amplifier circuit 10D includes a transistor Q3, a bias circuit 32, an adjustment circuit 60, a capacitor C9, and inductors L6 and L7. In FIG. 10, capacitors corresponding to the capacitors C3 and C4 illustrated in FIG. 3 are not illustrated.

As in the embodiment described above, the transistor Q2 (lower transistor) has a collector (first terminal) to which the power supply voltage Vcc (second power supply voltage) is supplied via the inductor L2, an emitter (second terminal) connected to ground, and a base (third terminal) to which the RF signal RF2 (second signal) is supplied via the capacitor C2.

The transistor Q3 (upper transistor) has a collector (first terminal) to which the power supply voltage Vcc (third power supply voltage) is supplied via the inductor L6, an emitter (second terminal) connected to ground via the inductor L7, and a base (third terminal) to which a bias current or bias voltage output from the bias circuit 32 is supplied via the adjustment circuit 60. The emitter of the transistor Q3 is also connected to the collector of the transistor Q2 via the capacitor C9. With this configuration, the transistor Q3 outputs, from the collector thereof, a signal obtained by amplifying the RF signal RF2.

The capacitor C9 (second capacitor) connects the emitter of the upper transistor Q3 and the collector of the lower transistor Q2 to each other. The capacitor C9 has a function of isolating the upper transistor Q3 and the lower transistor Q2 from each other for direct current and connecting the upper transistor Q3 and the lower transistor Q2 to each other for alternating current.

The inductor L7 (second inductor) has an end connected to the emitter of the upper transistor Q3 and another end grounded. The inductor L7 has a function of connecting the emitter of the upper transistor Q3 to ground for direct current.

The bias circuit 32 generates a bias current or bias voltage and supplies the bias current or bias voltage to the base of the upper transistor Q3 via the adjustment circuit 60.

The adjustment circuit 60 is disposed between the bias circuit 32 and the base of the upper transistor Q3. The adjustment circuit 60 adjusts the impedance seen from the base terminal of the transistor Q3 so that the amplitude variation of the voltage (driving voltage) to be supplied to the base of the transistor Q3 is not restricted by the bias circuit 32. That is, to turn on the upper transistor Q3, the base-emitter voltage of the transistor Q3 needs to be greater than or equal to a predetermined voltage. In other words, the base voltage of the transistor Q3 needs to vary with the emitter voltage of the transistor Q3. The adjustment circuit 60 functions to make the base voltage of the transistor Q3 vary for alternating current. The adjustment circuit 60 may include an inductor and a capacitor that are connected in series, for example.

The effect of the connection of the transistors Q2 and Q3, the capacitor C9, and the inductor L7 in the manner described above will be described, assuming that the power supply voltage Vcc is 3 V.

Since the power supply voltage Vcc (DC 3 V) is supplied to the collector of the lower transistor Q2 for direct current, the collector voltage of the lower transistor Q2 varies in a range of DC 3 V±AC 3 V. The emitter voltage of the upper transistor Q3 varies in a range of DC 0 V±AC 3 V since the emitter of the upper transistor Q3 is grounded for direct current and is connected to the collector of the lower transistor Q2 for alternating current. The collector voltage of the transistor Q3 varies in a range of DC 3 V±AC 6 V since the power supply voltage Vcc (DC 3 V) is supplied to the collector of the transistor Q3 for direct current and the signal amplitudes at the collector and emitter of the transistor Q3 are added together for alternating current. Accordingly, the signal amplitude across the collector and emitter of the upper transistor Q3 is the same as the signal amplitude across the collector and emitter of the lower transistor Q2, whereas the signal amplitude at the collector of the upper transistor Q3 is twice as high as the signal amplitude across the collector and emitter.

Given that the output power of a signal is denoted by P, the collector voltage by V, and the load impedance of an amplifier by R, then, a relationship given by $P=V^2/R$ is satisfied. In this case, to double the voltage amplitude and double the output power, the load impedance is doubled. In the power amplifier circuit 10D, accordingly, the load impedance can be doubled without necessarily increasing the power supply voltage Vcc, that is, the maximum output power of the signal can be increased, compared with the embodiment described above.

The number of transistors connected vertically is not limited to two and may be three or more. In addition, an end of the harmonic control circuit 51 may not necessary be connected to the collector of the upper transistor Q3, and may be connected to any location on a signal path extending from the collector of the lower transistor Q2 to the matching network 42 via the capacitor C9 and the transistor Q3.

Figure 11A:
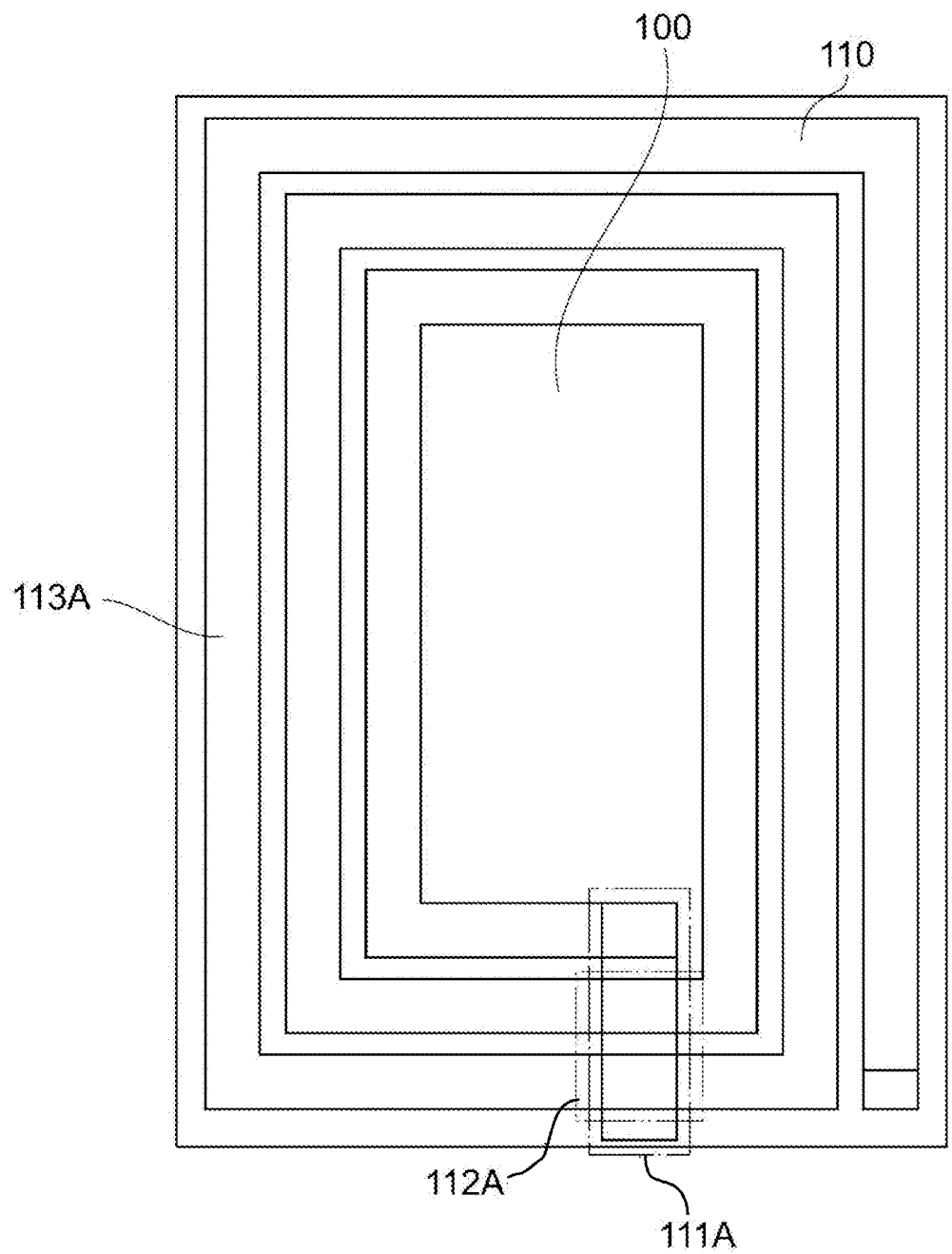
FIG. 11A is a plan view illustrating an example configuration of a semiconductor chip having the inductor of the parallel resonant circuit.
Figure 11B:
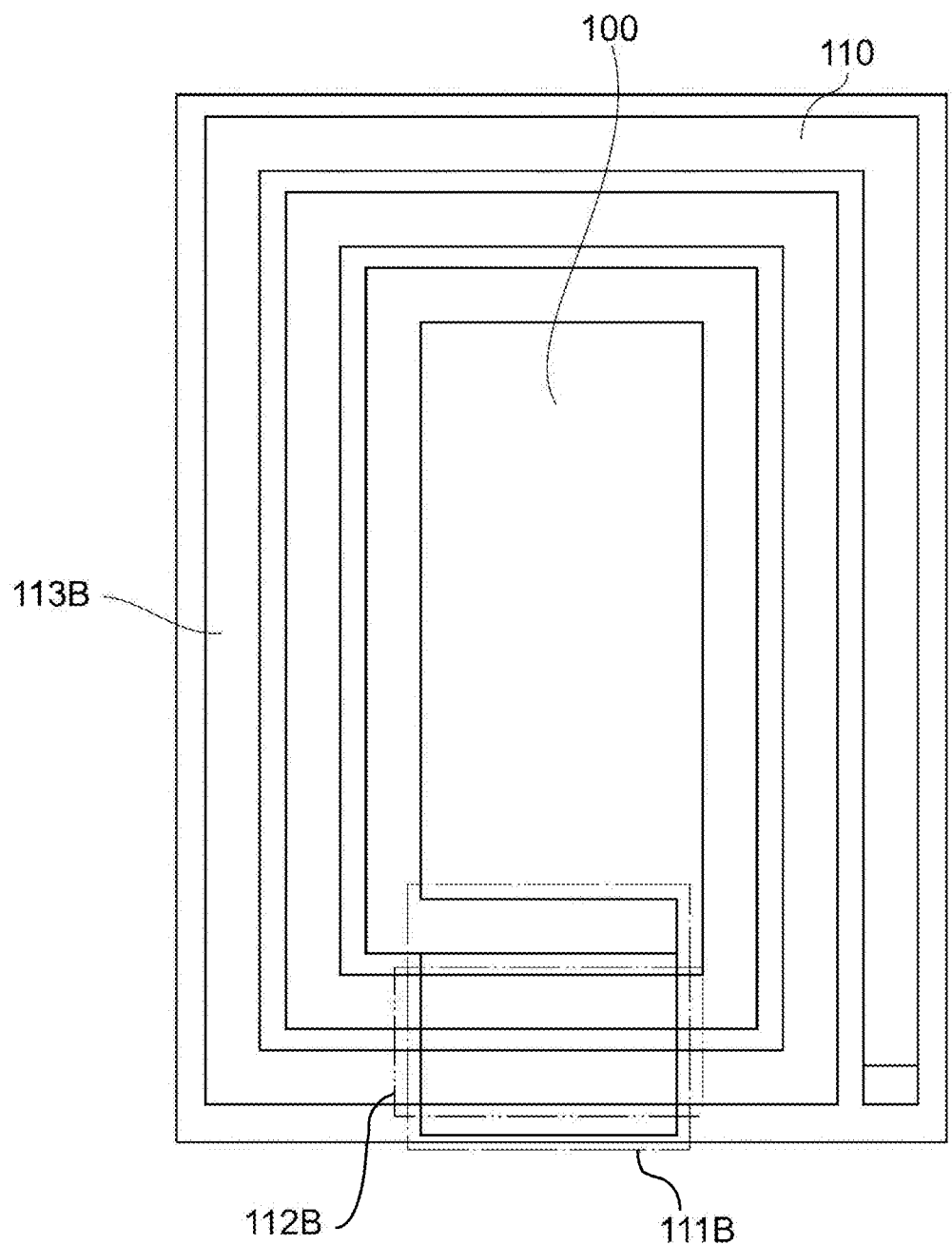
FIG. 11B is a plan view illustrating an example configuration of the semiconductor chip having the inductor of the parallel resonant circuit.

FIGS. 11A and 11B are plan views illustrating example configurations of a semiconductor chip having the inductor L4 of the parallel resonant circuit. Specifically, FIGS. 11A and 11B are plan views of a semiconductor chip 100 when a principal surface of the semiconductor chip 100 having the inductor L4 is viewed in plan. In the plan view of the principal surface of the semiconductor chip 100, a wiring 110 is routed in a substantially spiral pattern to form an inductance component. Specifically, the semiconductor chip 100 has a plurality of layers including a first layer and a second layer. The wiring 110 includes first portions 111A and 111B, second portions 112A and 112B, and third portions 113A and 113B. The first portions 111A and 111B are formed in the first layer of the semiconductor chip 100, the second portions 112A and 112B are formed in the second layer of the semiconductor chip 100, and the third portions 113A and 113B are formed in the first layer and the second layer. In the plan view of the semiconductor chip 100, the third portions 113A and 113B of the wiring 110 are non-crossing portions, and the first portions 111A and 111B and the second portions 112A and 112B of the wiring 110 cross. With this configuration, both ends of the wiring 110 extend to the outside of the area where the inductor L4 is formed.

As illustrated in FIG. 11B, for example, one of the first portion 111B and the second portion 112B of the wiring 110 having a smaller layer thickness (in this embodiment, the first portion 111B) can have a larger line width than the third portion 113B, which is a non-crossing portion of the wiring 110. With this configuration, the allowed amount of current flowing through the crossing portions can be increased compared with a configuration in which the line width of the first portion 111A and the second portion 112A is substantially equal to the line width of the third portion 113A (see FIG. 11A). The configuration illustrated in FIG. 11B can be applied to the inductor L4 through which a relatively large amount of current flows. In addition, since the line width of the first portion 111B is large, the resistance component contained in the wiring 110 can be reduced. Accordingly, when the configuration illustrated in FIG. 11B is applied to the inductor L4, the impact of a voltage drop can be suppressed.

Exemplary embodiments of the present disclosure have been described. The power amplifier circuits 10 and 10A to 10D include the amplifier 20 that amplifies the RF signal RF1, and the amplifier 21 arranged subsequent to the amplifier 20. The amplifier 21 amplifies the RF signal RF2 that is based on an output signal of the amplifier 20. The amplifier 20 performs class inverse-F operation, and the amplifier 21 performs class F operation. Accordingly, in a configuration including a plurality of amplifiers, high-efficiency power amplification can be implemented.

The power amplifier circuits 10A to 10D further include a parallel resonant circuit connected in series between an output end of the amplifier 20 and an input end of the amplifier 21, and a series resonant circuit connected in series between an output end of the amplifier 21 and the ground terminal. The parallel resonant circuit provides an open circuit for an even-order harmonic of a fundamental wave, which is included in the output signal of the amplifier 20, and the series resonant circuit provides a short circuit to ground potential for an even-order harmonic of the fundamental wave, which is included in an output signal of the amplifier 21. Accordingly, the amplifier 20 can be caused to perform class inverse-F operation, and the amplifier 21 can be caused to perform class F operation.

In the power amplifier circuits 10A, 10C, and 10D, the parallel resonant circuit includes the capacitor C7 and the inductor L4, which are connected in parallel with each other, and a power supply voltage is supplied to the amplifier 20 from an end of the inductor L4 closer to the amplifier 21 via the inductor L4. Since the parallel resonant circuit is located closer to the amplifier 20 than a power supply circuit, no consideration needs to be taken of the impedance on the power supply voltage Vcc side in the designing of the constants of the capacitor C7 and the inductor L4 of the parallel resonant circuit. Thus, the constants of the capacitor C7 and the inductor L4 can be easily designed.

In the power amplifier circuits 10A, 10B, and 10D, the inductor L4 is formed by the wiring 110 formed in or on a chip or board having a plurality of layers. The wiring 110 has the first portion 111B formed in a first layer among the plurality of layers, and the second portion 112B formed in a second layer among the plurality of layers, the second portion 112B crossing the first portion 111B in plan view of the chip or the board. At least one of the first portion 111B and the second portion 112B has a larger line width than the third portion 113B, which is a non-crossing portion of the wiring 110. With this configuration, the allowed amount of current flowing through the crossing portions can be increased compared with a configuration in which the line width of the first portion and the second portion is substantially equal to the line width of the third portion. In addition, the resistance component contained in the wiring can be reduced.

In the power amplifier circuit 10D, the amplifier 21 includes the transistor Q2 having a first terminal to which the power supply voltage Vcc is supplied, a second terminal to which ground potential is supplied, and a third terminal to which the RF signal RF2 is supplied; the capacitor C9; the transistor Q3 having a first terminal to which the power supply voltage Vcc is supplied and from which a signal obtained by amplifying the RF signal RF2 is output, a second terminal connected to the first terminal of the transistor Q2 via the capacitor C9, and a third terminal to which a driving voltage is supplied; the inductor L7 that connects the second terminal of the transistor Q3 to ground; and the adjustment circuit 60 that adjusts the driving voltage. With this configuration, the power amplifier circuit 10D can increase the maximum output power of a signal without necessarily increasing the power supply voltage Vcc, compared with the power amplifier circuits 10A to 10C.

The embodiments described above are intended to help easily understand the present disclosure, and are not to be used to construe the present disclosure in a limiting fashion. Various modifications or improvements can be made to the present disclosure without necessarily departing from the gist of the present disclosure, and equivalents thereof are also included in the present disclosure. That is, the embodiments may be appropriately modified in design by those skilled in the art, and such modifications also fall within the scope of the present disclosure so long as the modifications include the features of the present disclosure. For example, the elements included in the embodiments and the arrangement, materials, conditions, shapes, sizes, and the like thereof are not limited to those described in the illustrated examples, but can be modified as appropriate. Furthermore, the elements included in the embodiments can be combined as much as technically possible, and such combinations of elements also fall within the scope of the present disclosure so long as the combinations of elements include the features of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
a first amplifier configured to amplify a first signal;
a second amplifier configured to amplify a second signal based on an output signal of the first amplifier, the second amplifier being arranged subsequent to the first amplifier; and
a parallel resonant circuit connected in series between an output end of the first amplifier and an input end of the second amplifier,
wherein the first amplifier is configured to amplify the first signal according to a class inverse-F operation, and the second amplifier is configured to amplify the second signal according to a class F operation, and
wherein a first power supply voltage is supplied to the first amplifier via the parallel resonant circuit.

2. A power amplifier circuit comprising:
a first amplifier configured to amplify a first signal; and
a second amplifier configured to amplify a second signal based on an output signal of the first amplifier, the second amplifier being arranged subsequent to the first amplifier,
a parallel resonant circuit connected in series between an output of the first amplifier and an input of the second amplifier; and
a series resonant circuit connected between an output of the second amplifier and ground,
wherein the first amplifier is configured to amplify the first signal according to a class inverse-F operation, and the second amplifier is configured to amplify the second signal according to a class F operation,
wherein the parallel resonant circuit is configured to generate an open circuit for an even-order harmonic of a fundamental frequency of the output signal of the first amplifier, and
wherein the series resonant circuit is configured to generate a short circuit to ground for an even-order harmonic of a fundamental frequency of an output signal of the second amplifier.

3. The power amplifier circuit according to claim 2, wherein the fundamental frequency of the output signal of the first amplifier is the same as the fundamental frequency of the output signal of the second amplifier.

4. The power amplifier circuit according to claim 1, wherein the parallel resonant circuit comprises a first capacitor and a first inductor that are connected in parallel with each other.

5. The power amplifier circuit according to claim 2, wherein the parallel resonant circuit comprises a first capacitor and a first inductor that are connected in parallel with each other, and
wherein a first power supply voltage is supplied to the first amplifier via the first inductor.

6. The power amplifier circuit according to claim 4, wherein the first inductor is constituted by a wiring in or on a chip or board having a plurality of layers, wherein the wiring has a first portion in a first of the plurality of layers, and a second portion in a second of the plurality of layers,
wherein as seen in a plan view of the chip or the board, the second portion overlaps the first portion, and
wherein a width of the wiring of the first portion or the second portion is larger than a width of the wiring of a non-overlapping portion.

7. The power amplifier circuit according to claim 5,
wherein the first inductor is constituted by a wiring in or on a chip or board having a plurality of layers,
wherein the wiring has a first portion in a first of the plurality of layers, and a second portion in a second of the plurality of layers,
wherein as seen in a plan view of the chip or the board, the second portion overlaps the first portion, and
wherein a width of the wiring of the first portion or the second portion is larger than a width of the wiring of a non-overlapping portion.

8. A power amplifier circuit comprising:
a first amplifier configured to amplify a first signal; and
a second amplifier configured to amplify a second signal based on an output signal of the first amplifier, the second amplifier being arranged subsequent to the first amplifier,
wherein the first amplifier is configured to amplify the first signal according to a class inverse-F operation, and the second amplifier is configured to amplify the second signal according to a class F operation, and
wherein the second amplifier comprises:
a lower transistor having a first terminal to which a second power supply voltage is supplied, a second terminal that is grounded, and a third terminal to which the second signal is supplied;
a second capacitor;
an upper transistor having a first terminal to which a third power supply voltage is supplied and from which an output signal of the second amplifier is output, a second terminal connected to the first terminal of the lower transistor via the second capacitor, and a third terminal to which a driving voltage is supplied;
a second inductor that connects the second terminal of the upper transistor to ground; and
an adjustment circuit configured to adjust the driving voltage.

9. The power amplifier circuit according to claim 2,
wherein the second amplifier comprises:
a lower transistor having a first terminal to which a second power supply voltage is supplied, a second terminal that is grounded, and a third terminal to which the second signal is supplied;
a second capacitor;
an upper transistor having a first terminal to which a third power supply voltage is supplied and from which the output signal of the second amplifier is output, a second terminal connected to the first terminal of the lower transistor via the second capacitor, and a third terminal to which a driving voltage is supplied;
a second inductor that connects the second terminal of the upper transistor to ground; and
an adjustment circuit configured to adjust the driving voltage.

10. The power amplifier circuit according to claim 5,
wherein the second amplifier comprises:

a lower transistor having a first terminal to which a second power supply voltage is supplied, a second terminal that is grounded, and a third terminal to which the second signal is supplied;

a second capacitor;

an upper transistor having a first terminal to which a third power supply voltage is supplied and from which the output signal of the second amplifier is output, a second terminal connected to the first terminal of the lower transistor via the second capacitor, and a third terminal to which a driving voltage is supplied;

a second inductor that connects the second terminal of the upper transistor to ground; and an adjustment circuit configured to adjust the driving voltage.

11. The power amplifier circuit according to claim 7, wherein the second amplifier comprises:

a lower transistor having a first terminal to which a second power supply voltage is supplied, a second terminal that is grounded, and a third terminal to which the second signal is supplied;

a second capacitor;

an upper transistor having a first terminal to which a third power supply voltage is supplied and from which the output signal of the second amplifier is output, a second terminal connected to the first terminal of the lower transistor via the second capacitor, and a third terminal to which a driving voltage is supplied;

a second inductor that connects the second terminal of the upper transistor to ground; and an adjustment circuit configured to adjust the driving voltage.

12. The power amplifier circuit according to claim 2, wherein the series resonant circuit comprises a capacitor and an inductor that are connected in series with each other.

\* \* \* \* \*